United States Patent [19]

Moorby

[11] Patent Number: 5,418,931
[45] Date of Patent: May 23, 1995

[54] METHOD AND APPARATUS FOR DETECTING TIMING ERRORS IN DIGITAL CIRCUIT DESIGNS

[75] Inventor: Philip R. Moorby, Boxford, Mass.

[73] Assignee: Cadence Design Systems, Inc., San Jose, Calif.

[21] Appl. No.: 238,148

[22] Filed: May 3, 1994

Related U.S. Application Data

[63] Continuation of Ser. No. 858,558, Mar. 27, 1992, abandoned.

[51] Int. Cl.6 .................. G06F 11/263; G06F 17/50
[52] U.S. Cl. .................................. 395/500; 364/578
[58] Field of Search .................. 395/500, 550, 575; 371/22.1, 23; 364/578

[56] References Cited

U.S. PATENT DOCUMENTS

| | | | |
|---|---|---|---|
| 3,702,009 | 10/1972 | Baldwin | 395/500 |
| 3,775,598 | 11/1973 | Chao et al. | 371/23 |
| 4,687,988 | 8/1987 | Eichelberger et al. | 324/73.1 |
| 4,827,427 | 5/1989 | Hyduke | 364/489 |
| 4,907,180 | 3/1990 | Smith | 364/578 |
| 5,051,911 | 9/1991 | Kimura et al. | 364/468 |
| 5,051,938 | 9/1991 | Hyduke | 364/578 |
| 5,068,812 | 11/1991 | Schaefer et al. | 364/578 |
| 5,095,454 | 3/1992 | Huang | 364/578 |
| 5,105,374 | 4/1992 | Yoshida | 364/578 |
| 5,224,055 | 6/1993 | Grundy et al. | 364/488 |
| 5,274,568 | 12/1993 | Blinne et al. | 364/489 |
| 5,278,769 | 1/1994 | Bair et al. | 364/490 |
| 5,278,770 | 1/1994 | Gore et al. | 364/490 |
| 5,293,327 | 3/1994 | Ikeda et al. | 364/578 |
| 5,323,401 | 6/1994 | Maston | 371/27 |

OTHER PUBLICATIONS

"Estimating Untested (Electrical) in 4-0 FET . . . ", IBM Technical Disclosure Bulletin, Puri, vol. 20, No. 8, 1978, pp. 3210–3211.
"The application of Statistical Simulation to Automated Analog . . . " Elias, IEEE, vol. CAS-26, No. 7, Jul. 1979, pp. 513–517.
"Process Monitoring Oriented IC Testing", Maly, IEEE Aug. 1989, pp. 527–532.
"Computing Parametric Yield Accurately and Efficiently" Milor, IEEE, Nov. 1990, pp. 116–119.

Primary Examiner—Parshoian S. Lall
Assistant Examiner—Viet Vu
Attorney, Agent, or Firm—Judson D. Cary; A. C. Smith

[57] ABSTRACT

Disclosed is a system and method for simulating and detecting timing errors in digital circuit designs. The system consists of a logic simulator connected to various storage registers, a sequencer, and a randomizer, for simulating component functionality within the digital circuit design at sequential time increments using stored parametric data. The method includes selecting, for each component in a digital circuit design, a specific timing constraint from a range of possible timing constraint values, using a psuedo-random selection algorithm. The digital circuit is then simulated through a number of periods using this timing constraint. When an adequate number of periods have been simulated, a new set of timing constraints are selected. Timing requirement violations are detected and reported to a user.

4 Claims, 5 Drawing Sheets

METHOD AND APPARATUS FOR DETECTING TIMING ERRORS IN DIGITAL CIRCUIT DESIGNS

RELATED APPLICATIONS

This is a continuation of application Ser. No. 07/858,558, filed on Mar. 27, 1992, now abandoned.

BACKGROUND OF THE INVENTION

This invention relates generally to a method and apparatus for simulating the operation of digital circuit designs to detect timing errors in the design.

In the design of a digital circuit, the circuit designer typically selects from a variety of commercially available components or elements (herein "circuit elements") and connects them in a configuration for achieving the desired circuit. To assure that each basic circuit element functions correctly, the circuit design must accommodate all of the timing constraints of each element. For example, a memory element typically requires a minimum setup time on all address inputs before the activation of a strobe or clock signal. The circuit elements which provide the address and strobe signals must accordingly comply with these timing constraints if the correct function is to be implemented.

Similarly, following the initiation of a read cycle, the memory device supplies data to its output lines within some memory delay interval. The minimum speed with which the memory device responds to a read request will often determine whether the circuit signals meet the timing constraints of other circuit elements connected downstream from the memory device. Determining whether the timing constraints of all elements are satisfied becomes increasingly complicated as the number of layers of logic and the circuit complexity increase.

Designers can often isolate and correct timing violations by constructing and debugging a prototype circuit. However, debugging a prototype is particularly difficult with custom designed integrated circuits (ICs) since modifications to the IC cannot readily be implemented as with discrete circuit designs. Further, eliminating timing problems from a given prototype does not assure that other embodiments of the design will be free of timing problems. For example, due to manufacturing variations, a first memory chip can require a first setup time for all address bits during a read cycle while a second memory chip of the same design requires a slightly greater set up time. Thus, a prototype circuit made with the first memory chip can operate without error while a prototype made with the second could fail.

To assist circuit designers, manufacturers of circuit elements typically provide specifications which indicate the range over which an element's timing constraints will vary. However, assuring that every element of a circuit design meets all possible combinations of timing constraints for every element is complicated. Computer simulation of circuit designs is now widely used to assist designers in locating timing violations, particularly in complicated designs.

A dynamic timing analysis performs timing verification by simulating the operation of the circuit in response to a specified pattern of inputs. First, for each element, timing characteristics (e.g., gate delays and fixed setup times) are assigned which are within the range of possible timing characteristics for the element as specified by the manufacturer. The selected timing constraints, in effect, define a prototype of the circuit whose components have the selected characteristics. The computer then simulates the operation of the prototype circuit in response to a sequence of patterns.

A simulation approach which has found application in the area of system and circuit reliability assessment is the Monte Carlo technique. Monte Carlo reliability analysis involves the statistically random substitution of critical components having a spectrum of performance parameters ranging from a known minimum and maximum value. An example of a classical Monte Carlo analysis for a simple analog circuit might consist of the evaluation of the circuit performance using various values of a 100 ohm, 10% resistors. Resistor values ranging from a minimum of 90 ohms to a maximum of 110 ohms would be randomly substituted, and for each substitution the circuit would be resimulated to test for satisfactory performance. As the number of satisfactory random simulations increases, the assurance that the circuit will perform adequately over the 20 ohm resistance range correspondingly increases.

The principal drawback of the traditional Monte Carlo technique as applied to dynamic timing analysis is that the number of simulations required to have any reasonable confidence in the yield rate due to the numerous possible timing constraints is unmanageably high. A typical circuit may have hundreds of thousands of circuit elements each potentially having multiple timing constraints. For each time constraint a statistically significant number of simulations must be performed. And finally, for each simulation, a variety of varying input patterns must be tested. The number of simulations using this classical approach could easily reach the thousands.

What is needed is a more efficient method and apparatus for simulating digital circuit designs,

SUMMARY OF THE INVENTION

This invention relates to a method and apparatus for detecting violations of signal timing requirements of components in a circuit. The method includes selecting for each component in a circuit, a specific timing constraint from a range of possible timing constraint values, using a psuedo-random selection algorithm. The circuit is then simulated through a number of periods using this timing constraint. When an adequate number of periods have been simulated, a new set of timing constraints are selected. Violations of the timing requirements are detected and reported to a user.

DESCRIPTION OF A PREFERRED EMBODIMENT

Figure 1:
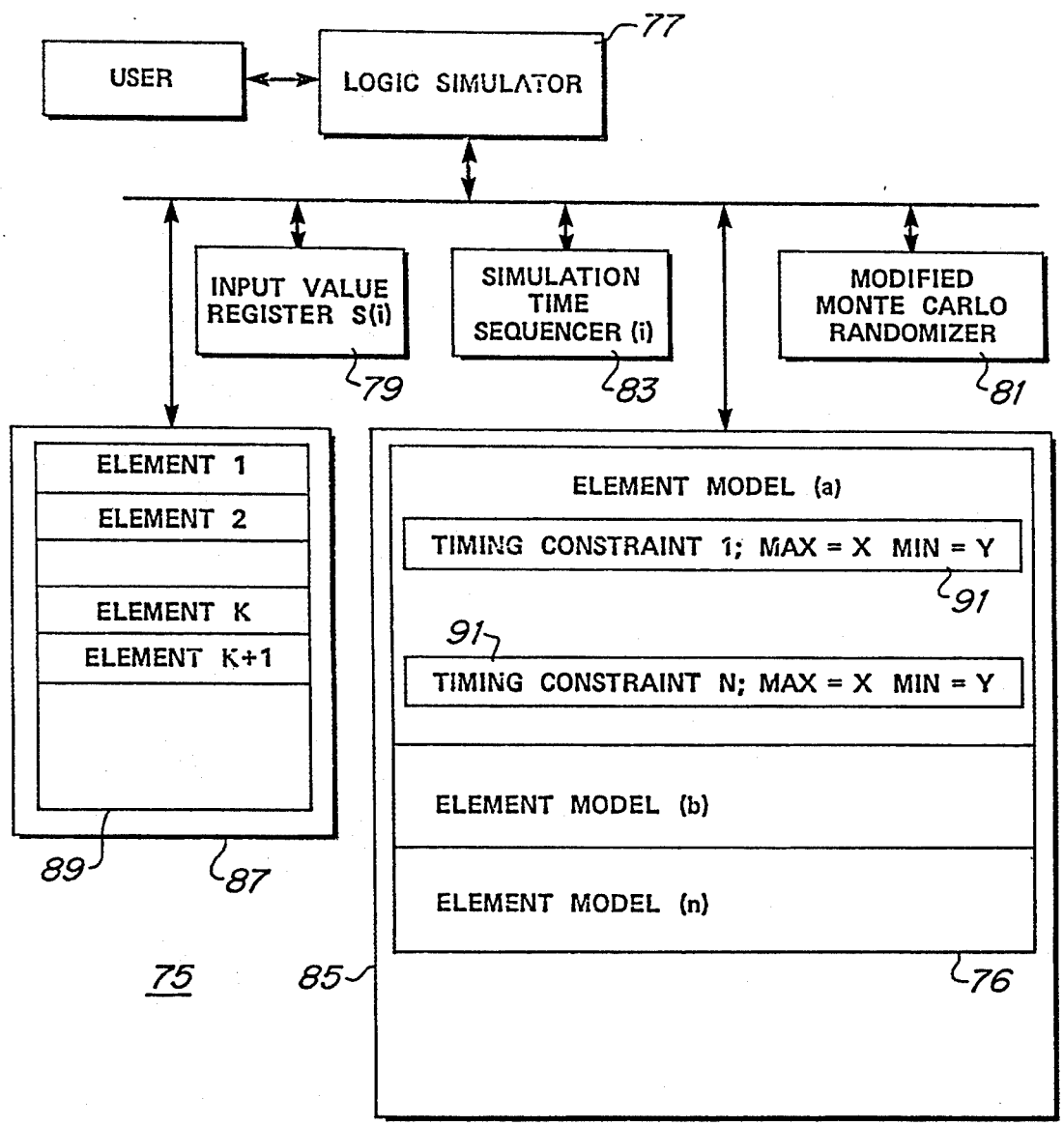
FIG. 1 is a block diagram of an apparatus for detecting timing violations in accordance with the present invention.

Referring now to FIG. 1, a simulator system 75 is shown for simulating the operation of digital circuit designs and detecting timing failures, such as race conditions and glitches, which may be introduced by variations in circuit element speeds and delay tolerances. In one embodiment, logic simulator 77 may be implemented using a general purpose computer in conjunction with simulation programming. Alternatively, a general purpose processor may be used to operate on special purpose simulation hardware designed to emulate the hardware circuitry being simulated. Connected to logic simulator 77, is net list register 87. Net list register 87 contains net list 89 which is a list of electronic elements comprising the digital circuit being simulated. In addition to a listing of circuit elements, net list 89 contains interconnection information relating each element to other elements of the circuit being simulated.

Model memory register 85 is a storage device for containing functional and parametric data related to each of the various electronic components identified in net list 89. Model memory register 85 consists of an array of element models 76. A separate element model 76 is maintained for each electronic component contained in the simulated circuit. Within each element model 76 is an array of model parameters 91. In the preferred embodiment, model parameters 91 include data on various timing constraints, for instance, describing the minimum (MIN=Y) and maximum (MAX=X) gate delays for the various simulated components.

Also connected to logic simulator 77 is input value register 79, simulation time sequencer 83, and randomizer 81. Input value register 79 allows the user to establish initial simulation values for the various components of the circuit being simulated. Simulation time sequencer 83 serves the function of an internal clock by storing the value for the simulation time period, and by notifying logic simulator 77 when the end of the simulation time period is reached. Randomizer 81 is a table containing a set of delay samples which have been generated using a user selected modification to a normal distribution function. Randomizer 81 will be discussed in greater depth below.

Figure 2:
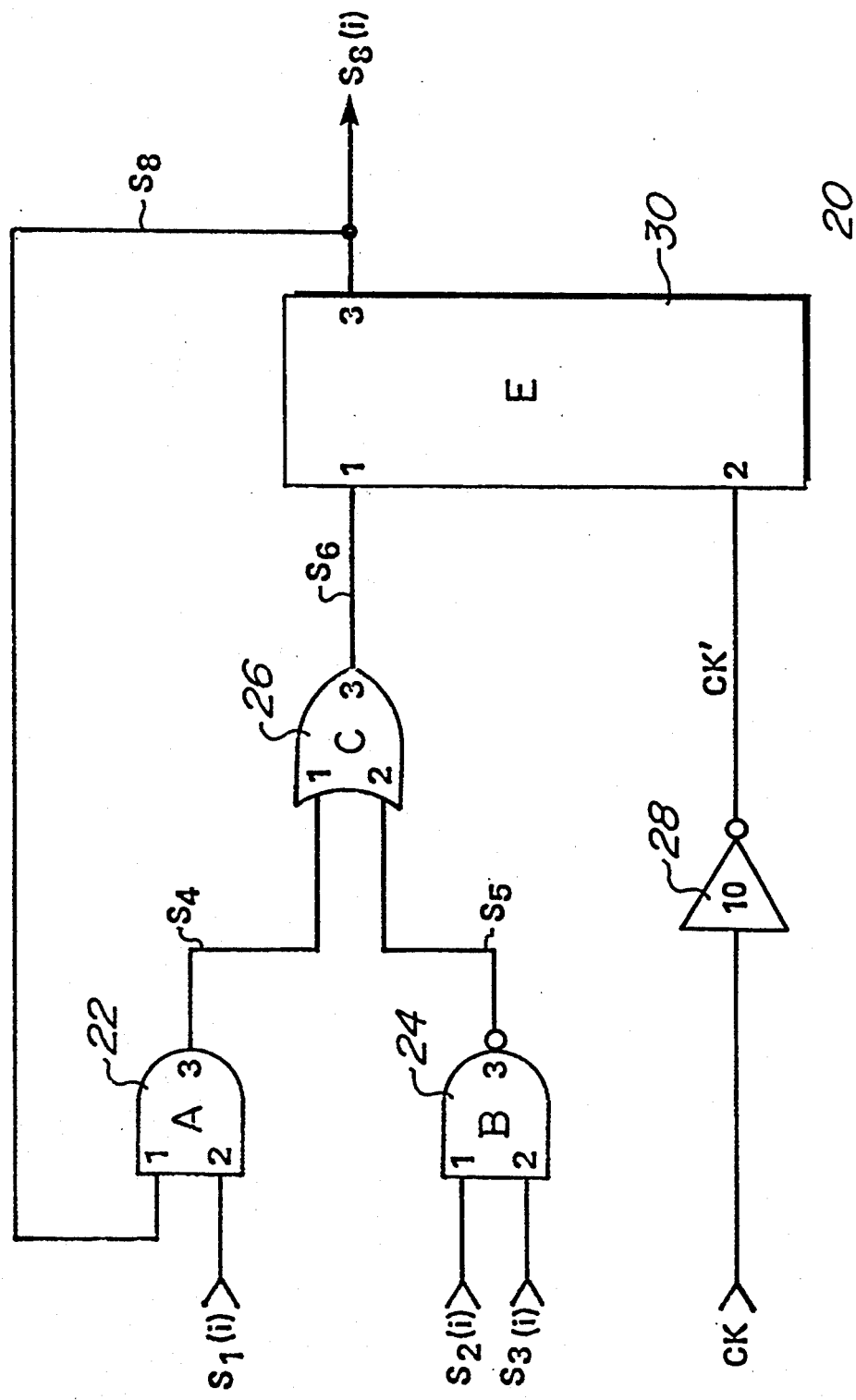
FIG. 2 is a schematic diagram of a circuit to be tested.
Figure 3:
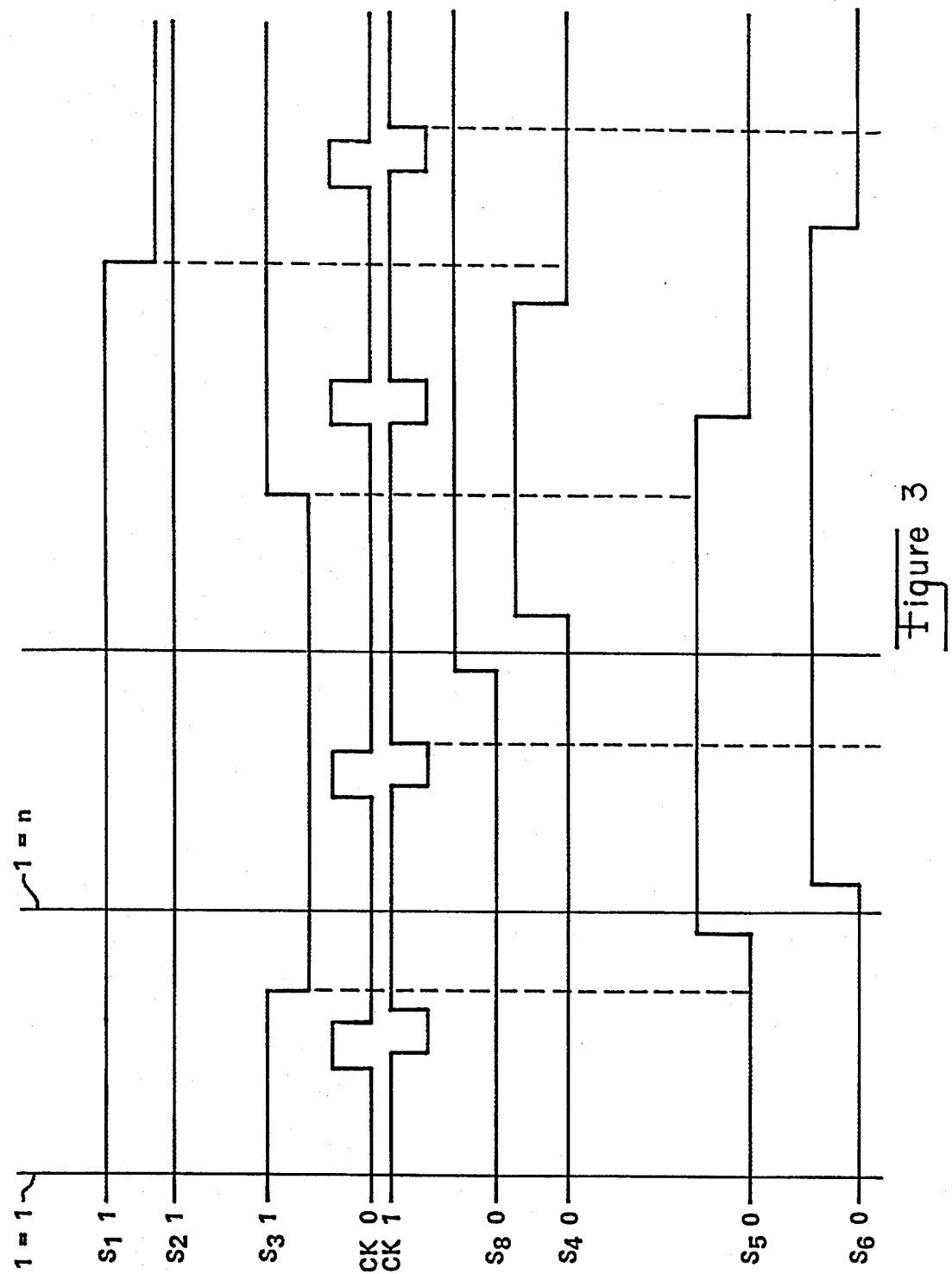
FIG. 3 is a timing diagram of a set of simulated input signals and of the simulated response to those inputs when applied to the circuit of FIG. 2.

Referring now to FIG. 2, a simple five element circuit 20, which may be typically analyzed using the apparatus of the present invention, is shown. The circuit consists of ANDA gate 22 and NANDB gate 24, an OR gate 26, an inverter circuit 28, and a flip flop 30. Signal inputs to circuit 20 include $S_1(i)$, $S_2(i)$, $S_3(i)$ and Clock (CK). The variable "i" refers to a time period during which the inputs remain stable at a constant value. The output which originates from flip flop 30 is designated SS(i). FIG. 3 shows a typical timing diagram for the operation of circuit 20 for various input changes $S_1(i)$, $S_2(i)$, $S_3(i)$ and CK.

Figure 4:
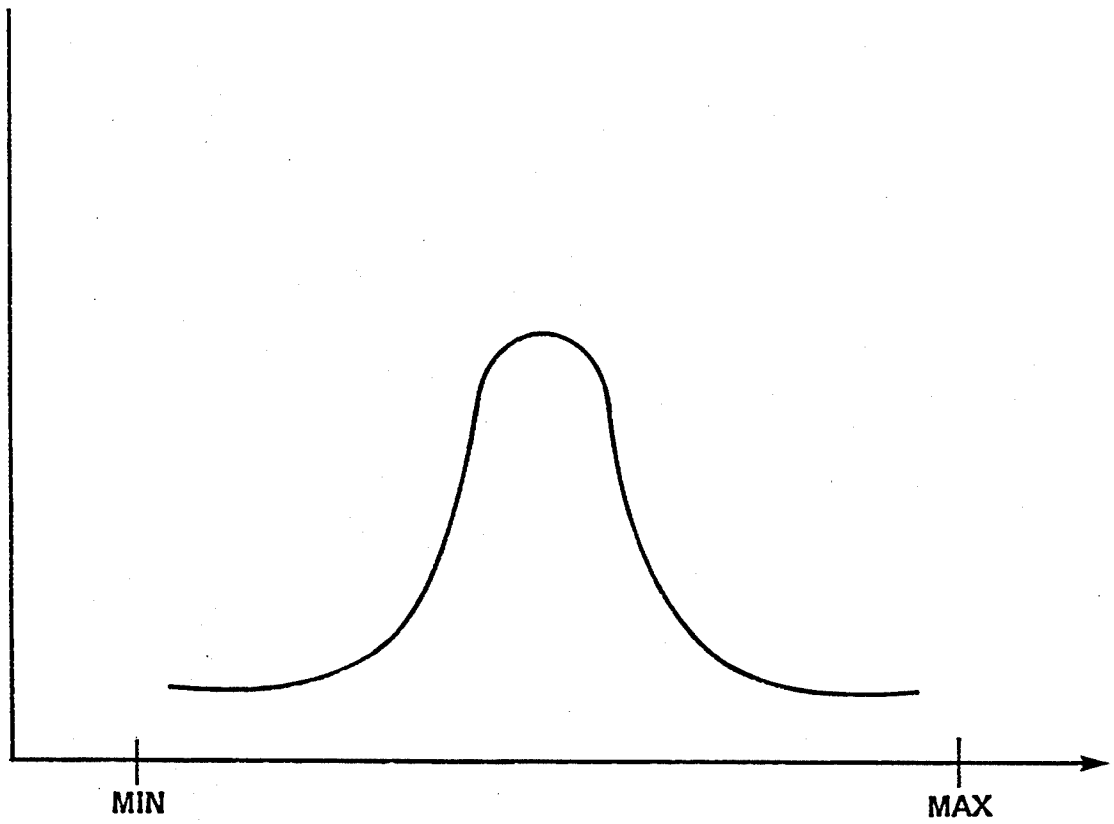
FIG. 4 is a chart illustrating variances in a component's timing constraints over a large number of manufacturing runs.

An important purpose for simulating circuit designs is to verify that for any given set or sequence of circuit inputs signals, an accurate and expected set of output signals are generated. A second reason for simulating circuits, and the one to which the present invention is primarily directed, is to verify that over predictable ranges of component performance specifications, the circuit functions accurately in its dynamic operation. The problem addressed can be easily understood by examining inverter circuit 28 of circuit 20. From the timing diagram of FIG. 3, it can be seen that the clock (CK) signal converts to an inverted clock signal (CK') as it passes through inverter circuit 28. The timing diagram also shows that a finite gate delay is encountered as the signal is transmitted through inverter circuit 28. This gate delay results from the inertial forces which must be overcome in initiating charge transfer within the internal semiconductor junctions of the electronic circuit element. Each inverter, and more generally, each digital component has a nominal gate delay which generally is an average of the delays for components produced in a common manufacturing process. Variations in materials and processes, however, produce variations in gate delays from component to component. Although these variations may normally be very small, the combined effect of hundreds of these delays can create unexpected results in the operation of the circuit. FIG. 4 shows a normal distribution of a typical inverter gate delay around a center point nominal delay.

Figure 5:
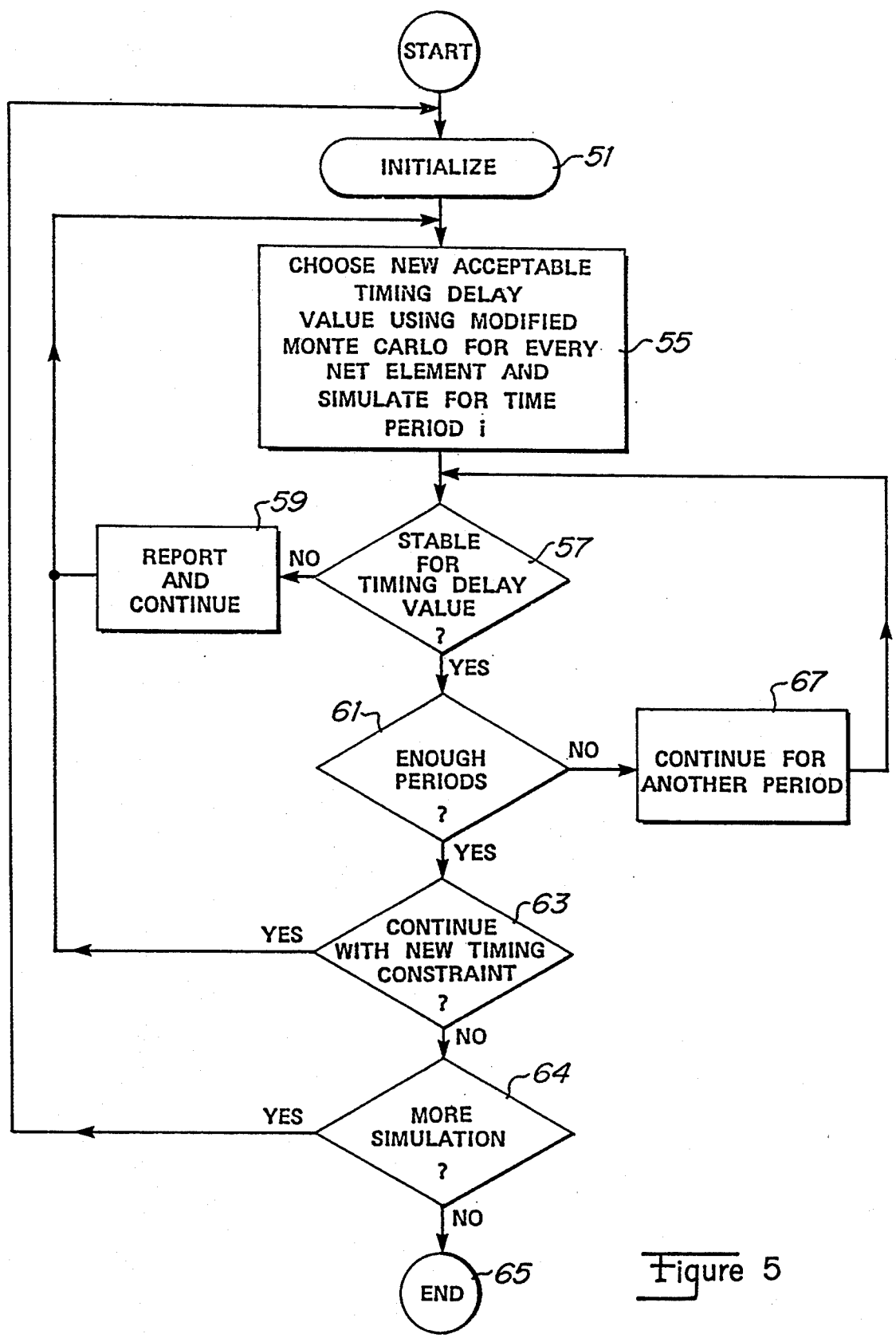
FIG. 5 is a flow diagram of a method for detecting timing violations in accordance with the present invention.

Referring now to FIG. 5, a method for testing digital circuits is shown which utilizes logic simulator system 75 of the present invention. The process is initiated in step 51 by the user who requests a simulation of a specific logic circuit as in 20. Models 91 of the various elements used in circuit 20 are stored in model memory register 85 by the user. Logic simulator 77 performs a net list evaluation on circuit 20 storing the net list 89 information in net list register 87. Starting input values $S_1(0)$, $S_2(0)$ and $S_3(0)$ and the simulation time period i may optionally be stored by the user to input value register 79 and simulation time sequencer 83 respectively. If no values are stored, default input values are generated and used by logic simulator 77.

Also occuring in initialization step 51, is the calculation of time delay variables by randomizer 81. As stated above, stored within randomizer 81 are various time delays at which the simulated circuit may be efficiently tested. Since most electronic elements used in the circuit will have delay times at or near their nominal values, testing near these nominal values is clearly important. It is also important to test at the maximum and minimum delay times, since these extremes represent worst case conditions within which all circuit failures are expected to occur.

Borrowing then from the classical Monte Carlo simulation approach, delay time values would be randomly selected from a range of values as determined by the delay constraint. For each delay time value, logic simulator 77 would evaluate circuit 20 performance over a number of timing periods with various changes made to the input values $S_1(i)$, $S_2(i)$ and $S_3(i)$. The major drawback of this approach, as stated above, is that an extremely large number of simulation runs must be performed in order to have reasonable confidence of adequate circuit performance.

This Monte Carlo technique can be modified to perform a partially randomized time delay analysis, with additional analytic emphasis placed at the time delay range extremes to compensate for the vulnerability of the circuitry at the minimum and maximum delays. Additional simulations can also be programmed by randomizer 81 to occur at the nominal time delay value, using the rationale that since this value represents the conditions under which most components will operate, testing at this point is particularly important.

The first step in applying this modified Monte Carlo approach is to allocate a number of total simulations to be performed on the circuit. The actual number to be used will be determined by such factors as the complexity of the circuit, the computer time or cost associated with each simulation run, and the probability of finding an error in the circuit with any given number of simulations. Once the total run number is determined, the user arbitrarily assigns a portion of these simulations to be performed at the extremes of the time delays for the given component. The remaining unallocated simulations are then performed using time delays which are randomly chosen between the endpoints. As a numerical example, the user could determine that circuit 20 will undergo 1000 simulations for a nominal gate delay of 8 nS. The minimum gate delay which can be expected is 5nS., the maximum delay is 10 nS. The user then specifies arbitrarily that 200 simulations will be performed at each endpoint, and the remaining 600 simulations will be randomly distributed between the extremes.

A second modification to the classical Monte Carlo technique is to make changes to the time delay values, while simultaneously making changes to the input states. More specifically, following initialization of logic simulator 77, a time delay value would be selected from randomizer 81. Along with the selection of a time delay value, the input states of circuit 20 are selected from input value register 79 and the circuit is simulated for time period i. Following the simulation in this second modification to the classical Monte Carlo technique, a new set of input state values could be selected from input value register 79 and the simulation rerun using the previous time delay. Alternatively, a new time delay could be selected from randomizer 81 with each change or few changes in input values. In the classical approach to the Monte Carlo technique, the time delay value is changed and subsequently numerous input signal value changes are made for the single value of time delay. Using the modified scheme of the present invention, changes to the time delay value could be made frequently with respect to input value changes. In the extreme of this suggested modification, a new time delay value will be selected for each change to the input sequence. Implementation of this second modified Monte Carlo technique can be user programmed at initialization step 51 by storing appropriate sequencing data into simulation time sequencer 83.

Once initialization 51 is complete, logic simulator 77 sets the time period i to the value stored in sequencer 83. Logic simulator 77 then in step 55 polls randomizer 81 for the first simulation delay time. Simulation is then carried out for time period i, during which, in step 57, the logic simulator 77 continually checks the various circuit component outputs for timing glitches and race conditions. If a timing problem is identified, logic simulator 77 notifies the user of the anomaly and returns to step 55 to continue simulation for a different period.

As simulation proceeds and the end of the timing period is reached in step 61, a processing decision is made based on data stored in sequencer 83, whether to continue with an additional period in step 67. If no additional periods are programmed, step 63 allows the simulator to either loop back to step 55 and select a new time delay, or continue to step 64 where additional simulation can be selected. If additional simulation is desired, initialization recurs in step 51 and the sequence above is repeated. The simulation terminates in step 65.

I claim:

1. A system for simulating and detecting timing errors in a circuit design that includes electronic components, the system comprising:

a net list register for storing a net list of electronic components in a circuit design;

a model memory register for storing parametric timing constraint data comprising a minimum and a maximum time delay value for each electronic component in said circuit design;

an input value register for storing simulation input values for said circuit design;

a sequencer for storing a simulation time period value and for providing notification when the end of said simulation time period is reached;

a randomizer for generating and storing a set of delay samples associated with each electronic component as a function of a range defined by said minimum and said maximum time delay values associated with each electronic component, wherein a greater number of delay samples are generated and stored at said minimum and said maximum time delay values than at other delay times within the range; and a logic simulator connected to said net list register, model memory register, input value register, sequencer, and randomizer, for simulating the circuit design in order to detect timing errors, wherein said simulation values are used as inputs to said circuit design and a time delay is chosen for each electronic component from said set of delay samples associated with each electronic component, wherein the time delay chosen for a first component is independent of the time delay chosen for a second component.

2. A system for simulating and detecting timing errors in a circuit design that includes electronic components, the system comprising:

a net list register for storing a net list of electronic components in a circuit design;

a model memory register for storing parametric timing constraint data comprising a nominal time delay value for each electronic component in said circuit design;

an input value register for storing simulation input values for said circuit design;

a sequencer for storing a simulation time period value and for providing notification when the end of said simulation time period is reached;

a randomizer for generating and storing a set of delay samples associated with each electronic component as a function of said nominal time delay associated with each electronic component, wherein a greater number of delay samples are generated and stored at said nominal time delay value than at other delay times for each electronic component; and a logic simulator connected to said net list register, model memory register, input value register, sequencer, and randomizer, for simulating the circuit design in order to detect timing errors, wherein said simulation values are used as inputs to said circuit design and a time delay is chosen for each electronic component from said set of delay samples associated with each electronic component, wherein the time delay chosen for a first component is independent of the time delay chosen for a second component.

3. In a simulation system, a method for simulating and detecting timing errors in a circuit that includes a plurality of circuit components, each component having a minimum delay and a maximum delay, the method comprising the steps of:

randomly generating a set of delay times associated with each component in said circuit design as a function of a range defined by said minimum and said maximum delays for each component, wherein a greater number of delay times are generated at said minimum and said maximum delays than at other delay times for each component;

selecting input states to said circuit design;

selecting a delay time for each component in said circuit design from said set of delay times associated with each component, wherein the delay time chosen for a first component is independent of the delay time chosen for a second component; and simulating for a fixed time period to detect timing errors in said circuit design with said selected input states applied as inputs to said circuit design and with each said selected delay time applied to each associated component.

4. In a simulation system, a method for simulating and detecting timing errors in a circuit that includes circuit components each component having a nominal delay time, the method comprising the steps of:

randomly generating a set of delay times associated with each component in said circuit design wherein a greater number of delay times are generated at the nominal delay time than at other delay times for each component;

selecting input states to said circuit design;

selecting a delay time for each component in said circuit design from said set of delay times associated with each component, wherein the delay time chosen for a first component is independent of the delay time chosen for a second component; and simulating for a fixed time period to detect timing errors in said circuit design with said selected input states applied as inputs to said circuit design and with each said selected delay time applied to each associated component.

* * * * *